(12) United States Patent
Okada

(10) Patent No.: US 7,106,087 B2
(45) Date of Patent: Sep. 12, 2006

(54) METHOD AND APPARATUS FOR EVALUATING SEMICONDUCTOR DEVICE

(75) Inventor: Kenji Okada, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/131,391

(22) Filed: May 18, 2005

(65) Prior Publication Data

US 2006/0044000 A1   Mar. 2, 2006

(30) Foreign Application Priority Data

Aug. 31, 2004   (JP)   ............... 2004-251507

(51) Int. Cl.
   *G01R 31/26* (2006.01)
(52) U.S. Cl. .................................... 324/765
(58) Field of Classification Search ............. None
   See application file for complete search history.

(56) References Cited

U.S. PATENT DOCUMENTS 6,633,177 B1 * 10/2003 Okada .................. 324/765

OTHER PUBLICATIONS

Koyama et al; "Degradation Mechanism of HfSiON Gate Insulator and Effect of Nitrogen Composition on the Statistical Distribution of the Breakdown" *IEEE*; c. 2003; pp. 931-934; Japan.
Okada et al.; "Degradation Mechanism of HfAlO/SiO Stacked Gate Dielectric Films Through Transient and Steady State Leakage Current Analysis"; *Extended Abstracts of the 2004 International Conference on Solid State Devices and Materials*; c. 2004; pp. 76-77; Tokyo.

* cited by examiner

*Primary Examiner*—Paresh Patel
*Assistant Examiner*—Roberto Velez
(74) *Attorney, Agent, or Firm*—McDermott Will & Emery LLP

(57) ABSTRACT

Gate voltage sweeping is performed on a semiconductor element using a multilayer insulating film including a lower insulating film whose thickness is to be obtained. A low voltage peak current mode is extracted from the resultant current-voltage characteristic, so that a peak voltage and a peak current amount in this mode are obtained. The thickness of the lower insulating film is obtained based on the obtained peak voltage or peak current amount and a previously-obtained correlation between the peak voltage or peak current amount and the thickness of the lower insulating film.

2 Claims, 8 Drawing Sheets

METHOD AND APPARATUS FOR EVALUATING SEMICONDUCTOR DEVICE

CROSS-REFERENCE TO RELATED APPLICATION

The disclosure of Japanese Patent Application No. 2004-251507 filed on Aug. 31, 2004 including specification, drawings and claims is incorporated herein by reference in its entirety.

BACKGROUND OF THE INVENTION

The present invention relates to methods and apparatus for evaluating semiconductor devices, and particularly to a method for evaluating the thickness and dielectric breakdown lifetime of an insulating film in a semiconductor element in which a multilayer insulating film as a stack of two or more insulating films is used as a gate insulating film, a capacitive insulating film or an interlayer insulating film, and to an evaluation apparatus for the method.

With recent enhancement of the integration degree, functions and speed of semiconductor integrated circuit devices, the thicknesses of gate insulating films have decreased, so that previously-used silicon dioxide films ($SiO_2$ films) have become insufficient to satisfy specifications such as a standard for the amount of leakage current. In view of this, gate insulating films using new high-κ materials such as hafnium-based materials (e.g., $HfO_x$, $HfSiO_x$, $HfAlO_x$, and $HfO_xN_y$) are proposed.

These high-κ materials are expected to be used not only for gate insulating films but also for capacitive insulating films in memories, e.g., an interlayer insulating film between a control gate electrode and a floating gate electrode in a flash memory, or tunnel insulating films, for example.

For such insulating films, a multilayer structure of two or more layers including a high-κ film and either a silicon dioxide film (a $SiO_2$ film) or a silicon nitride film (a $Si_3N_4$ film) is generally adopted.

In these circumstances, methods for accurately evaluating a physical thickness of each layer in an insulating film with a multilayer structure have been required. In addition, methods for accurately evaluating the reliability of a gate insulating film with such a multilayer structure, i.e., for accurately predicting the dielectric breakdown lifetime, have also been needed.

As a conventional method for evaluating the physical thickness of each layer in an insulating film having a multilayer structure, cross-section transmission electron microscope (TEM) observation for evaluating the cross-sectional structure and thickness of the insulating film by using a TEM has been adopted in most cases. To accurately predict a dielectric breakdown lifetime, it is inevitable to accurately evaluate the dependence of the lifetime on a stress voltage. In conventional techniques, a dielectric breakdown lifetime is predicted by performing a large number of measurements by using samples to obtain the time required for dielectric breakdown of gate insulating films to occur in actual operation with application of various stress voltages to the samples, i.e., performing a large number of lifetime measurements, and statistically processing results of these measurements (see, for example, M. Koyama et al., International Electron Devices Meeting (IEDM), 2004, pp. 931 to 934).

SUMMARY OF THE INVENTION

However, the cross-section TEM observation has disadvantages that TEM observation is a destructive test and that fabrication of samples for the TEM observation needs considerable time and cost.

In addition, accurate prediction of a dielectric breakdown lifetime requires an enormous amount of time for measurement.

It is therefore an object of the present invention to provide methods for easily and accurately evaluating the thickness and dielectric breakdown lifetime of an insulating film without using a physical technique such as cross-section TEM observation. More specifically, these methods are used for multilayer insulating films such as gate insulating films or capacitive insulating films each made of two or more insulating films and included in a semiconductor element.

To achieve the object described above, a first method for evaluating a semiconductor device according to the present invention is a method for obtaining a thickness of a lowermost insulating film constituting an insulating film that has a multilayer structure and is included in a semiconductor element. The method includes the steps of: (a) measuring, as a peak voltage, a voltage applied between a pair of electrodes sandwiching the insulating film therebetween when the absolute value of the amount of a current flowing in the insulating film upon application of a voltage between the pair of electrodes is at a local maximum; and (b) obtaining a thickness of the lowermost insulating film based on the peak voltage measured at the step (a) and a previously-obtained relationship between the peak voltage and the thickness of the lowermost insulating film.

A second method for evaluating a semiconductor device according to the present invention is a method for obtaining a thickness of a lowermost insulating film constituting an insulating film that has a multilayer structure and is included in a semiconductor element. The method includes the steps of: (a) measuring, as a peak current amount, the amount of a current flowing in the insulating film upon application of a voltage between a pair of electrodes sandwiching the insulating film therebetween when an absolute value of the amount of the current is at a local maximum; and (b) obtaining a thickness of the lowermost insulating film based on the peak current amount measured at the step (a) and a previously-obtained relationship between the peak current amount and the thickness of the lowermost insulating film.

A third method for evaluating a semiconductor device according to the present invention is a method for obtaining a dielectric breakdown lifetime of an insulating film that has a multilayer structure and is included in a semiconductor element under application of a given stress voltage. The method includes the steps of: (a) measuring, as a reference dielectric breakdown lifetime, a time required for dielectric breakdown of the insulating film to occur by application of a reference stress voltage between a pair of electrodes sandwiching the insulating film therebetween; (b) measuring the amount of a variation of a peak voltage caused by the application of the reference stress voltage, the peak voltage being a voltage applied between the pair of electrodes when an absolute value of the amount of a current flowing in the insulating film upon application of the voltage between the pair of electrodes is at a local maximum; (c) obtaining a first saturation time required for the amount of the variation of the peak voltage measured at the step (b) to be saturated, (d) measuring the amount of a variation of the peak voltage caused by the application of the given stress voltage; (e) obtaining a second saturation time required for the amount of the variation of the peak voltage measured at the step (d) to be saturated; and (f) obtaining the dielectric breakdown lifetime under the application of the given stress voltage, based on the reference dielectric breakdown lifetime measured at the step (a), the first saturation time obtained at the step (c) and the second saturation time obtained at the step (e).

A first apparatus for evaluating a semiconductor device according to the present invention is an apparatus for obtaining a thickness of a lowermost insulating film constituting an insulating film that has a multilayer structure and is included in a semiconductor element. The apparatus includes: a wafer stage for holding the semiconductor element; a probe for applying a given voltage between a pair of electrodes sandwiching the insulating film therebetween; and an ammeter for measuring the amount of a current flowing in the insulating film, wherein the amount of a current flowing in the insulating film upon application of a voltage between the pair of electrodes by using the probe is measured by using the ammeter, and a voltage applied between the pair of electrodes when an absolute value of the measured amount of the current is at a local maximum is obtained as a peak voltage, and a thickness of the lowermost insulating film is obtained based on the obtained peak voltage and a previously-obtained relationship between the peak voltage and the thickness of the lowermost insulating film.

A second apparatus for evaluating a semiconductor device according to the present invention is an apparatus for obtaining a thickness of a lowermost insulating film constituting an insulating film that has a multilayer structure and is included in a semiconductor element. The apparatus includes: a wafer stage for holding the semiconductor element; a probe for applying a given voltage between a pair of electrodes sandwiching the insulating film therebetween; and an ammeter for measuring the amount of a current flowing in the insulating film, wherein the amount of a current flowing in the insulating film upon application of a voltage between the pair of electrodes by using the probe is measured by using the ammeter, and the amount of the current when the absolute value of the measured amount of the current is at a local maximum is obtained as a peak current amount, and a thickness of the lowermost insulating film is obtained based on the obtained peak current amount and a previously-obtained relationship between the peak current amount and the thickness of the lowermost insulating film.

A third apparatus for evaluating a semiconductor device according to the present invention is an apparatus for obtaining a dielectric breakdown lifetime of an insulating film that has a multilayer structure and is included in a semiconductor element under application of a given stress voltage. The apparatus includes: a wafer stage for holding the semiconductor element; a probe for applying a given voltage between a pair of electrodes sandwiching the insulating film therebetween; and an ammeter for measuring the amount of a current flowing in the insulating film, wherein a time required for dielectric breakdown of the insulating film to occur by application of a reference stress voltage between the pair of electrodes by using the probe is measured as a reference dielectric breakdown lifetime; the amount of a current flowing in the insulating film upon application of a voltage between the pair of electrodes by using the probe is measured by using the ammeter, and the amount of a variation of a peak voltage, which is a voltage applied between the pair of electrodes when an absolute value of the measured amount of the current is at a local maximum, caused by the application of the reference stress voltage is obtained, a first saturation time required for the amount of the variation of the peak voltage caused by the application of the reference stress voltage to be saturated is obtained, the amount of a variation of the peak voltage caused by the application of the given stress voltage is obtained, a second saturation time required for the amount of the variation of the peak voltage caused by the application of the given stress voltage to be saturated is obtained, and the dielectric breakdown lifetime under the application of the given stress voltage is obtained, based on the reference dielectric breakdown lifetime, the first saturation time and the second saturation time.

With methods and apparatus for evaluating a semiconductor device according to the present invention, the thickness and dielectric breakdown lifetime of a film such as a gate insulating film and a capacitive insulating film are evaluated without the use of a physical technique such as cross-section TEM observation. In addition, the dielectric breakdown lifetime is accurately predicted without performing a large number of lifetime measurements for statistical processing of the results thereof. Accordingly, the thickness and dielectric breakdown lifetime of an insulating film are easily and accurately evaluated.

As described above, the present invention relates to methods and apparatus for evaluating a semiconductor device. The present invention is very effective when applied to a semiconductor element using a multilayer insulating film formed by stacking two or more insulating films as a gate insulating film, for example. This is because the thickness and dielectric breakdown lifetime of, for example, a gate insulating film are easily and accurately obtained in this application.

when constant voltage stress is repeatedly applied to a MOS capacitor including a gate insulating film with a multilayer structure.

Figure 8:
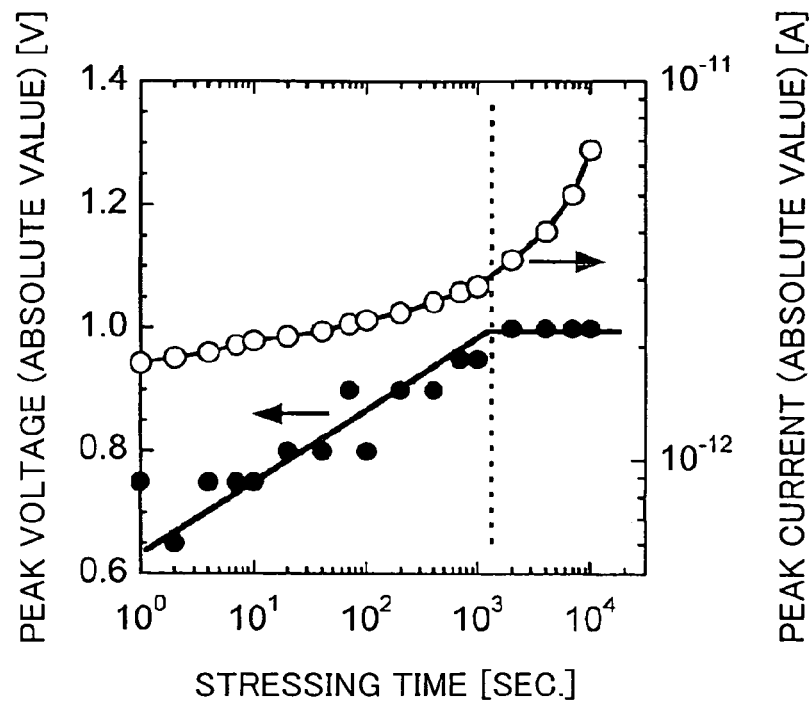

FIG. 8 is a graph showing variations of the peak voltage ($V_p$) and the peak current amount ($I_p$) of a low voltage peak current mode when constant voltage stress is repeatedly applied to a MOS capacitor including a gate insulating film with a multilayer structure.

Figure 9:
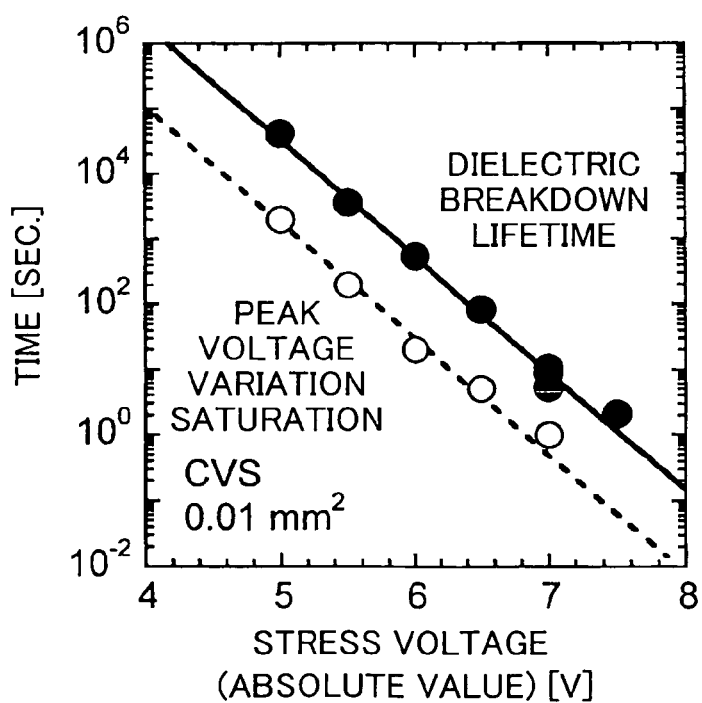

FIG. 9 is a graph showing dependence of a dielectric breakdown lifetime and a peak voltage variation saturation time on a stress voltage.

Figure 10:
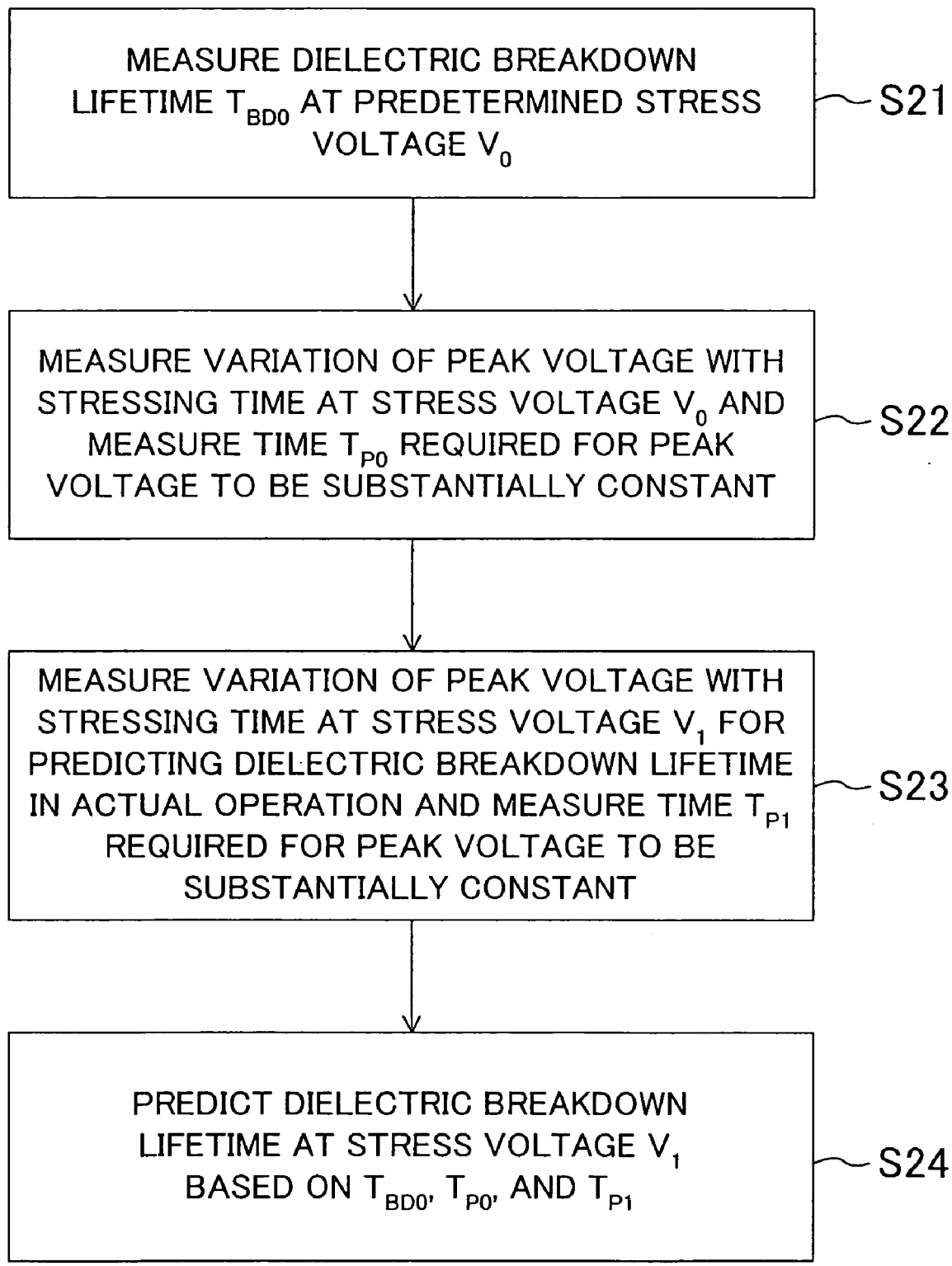

FIG. 10 is a flowchart of a method for evaluating a semiconductor device (a method for predicting the dielectric breakdown lifetime of a gate insulating film) according to a second embodiment of the present invention.

Figure 11:
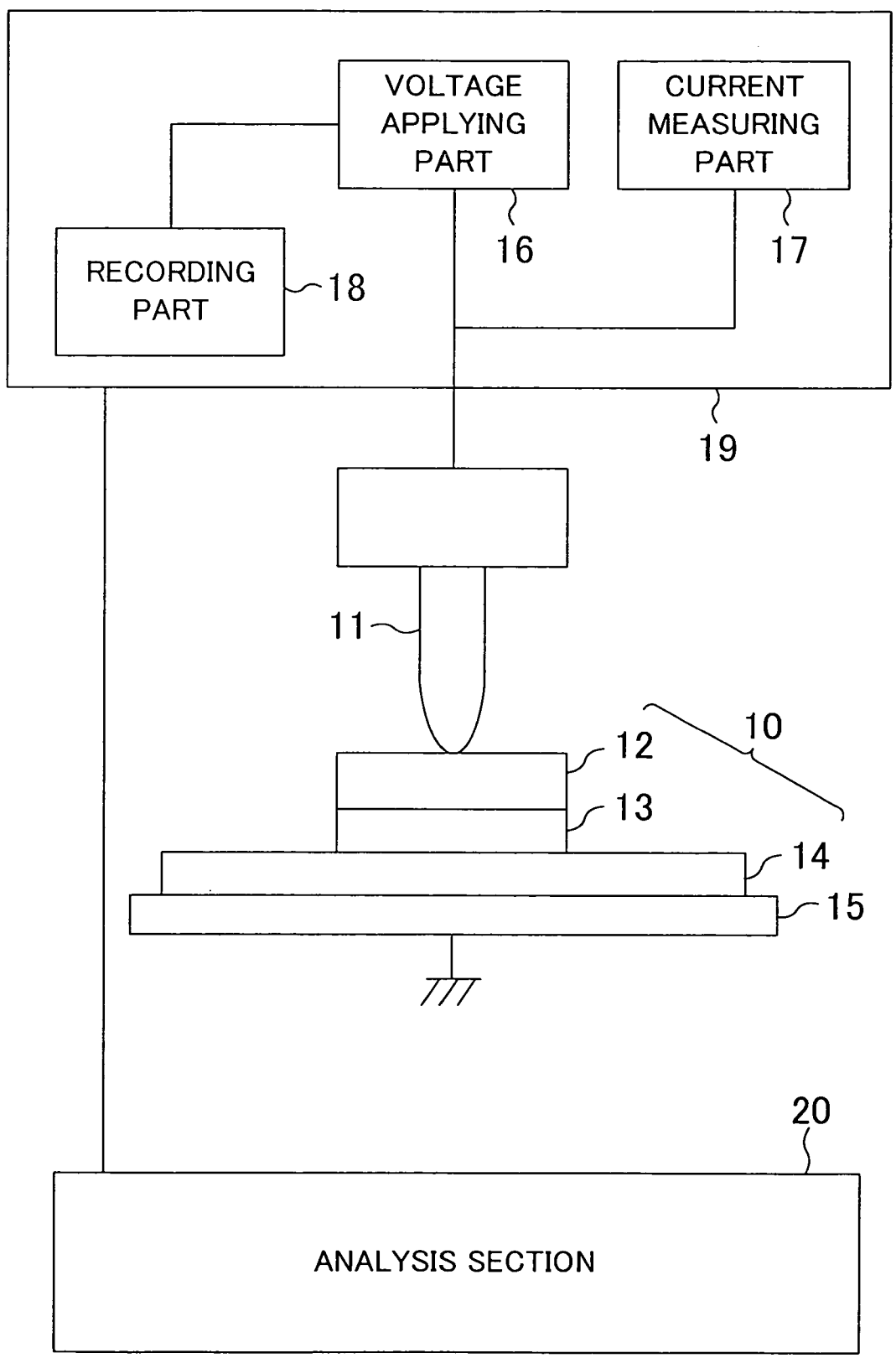

FIG. 11 is a view schematically showing an example of a configuration of an apparatus for evaluating a semiconductor device (an apparatus for evaluating an insulating film) according to a third embodiment of the present invention.

DESCRIPTION OF THE PREFERRED EMBODIMENTS

The following embodiments of the present invention are based on the assumption that a gate electrode structure including a pair of electrodes sandwiching an insulating film therebetween is adopted and one of the pair of electrodes is a gate electrode and the other is a substrate (electrode), for simplicity. However, the present invention is not limited to this gate electrode structure. For example, the present invention is also established even in cases where structures such as a capacitive insulating film structure sandwiched between a lower electrode and an upper electrode of a memory, an interlayer insulating film sandwiched between a control gate electrode and a floating gate electrode of a flash memory, and a tunnel insulating film are adopted.

Though the electrodes sandwiching the insulating film therebetween are not a gate electrode and a substrate (electrode), respectively, in some cases as described above, the present invention includes such cases, and one of the electrodes sandwiching the insulating film will be referred to as a gate electrode and the other will be referred to as a substrate (electrode) in the following description.

Embodiment 1

Hereinafter, a method for evaluating a semiconductor device according to a first embodiment of the present invention will be described with reference to drawings.

Figure 1A:
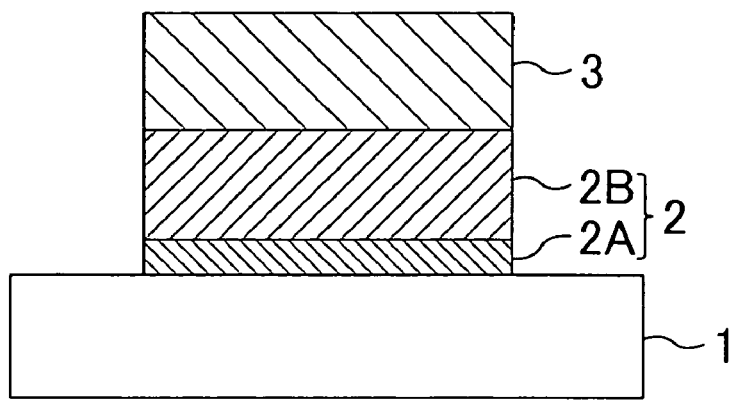
FIG. 1A is a cross-sectional view showing a structure of a sample for use in a method for evaluating a semiconductor device according to a first embodiment of the present invention.

FIG. 1A simply illustrates a cross-sectional structure of a sample for use in measurement of data that will be described below. As shown in FIG. 1A, a gate insulating film 2 made up of a $SiO_2$ film 2A as a lower layer and a $HfAlO_x$ film 2B as an upper layer is formed on a silicon substrate 1. A gate electrode 3 made of polysilicon is formed on the gate insulating film 2. Phosphorus is implanted in the gate electrode 3 as an impurity. In this case, the $HfAlO_x$ film 2B is a high dielectric constant (high-κ) film and the $SiO_2$ film 2A is an interlayer (IL) film or a lower insulating film.

Figure 1B:
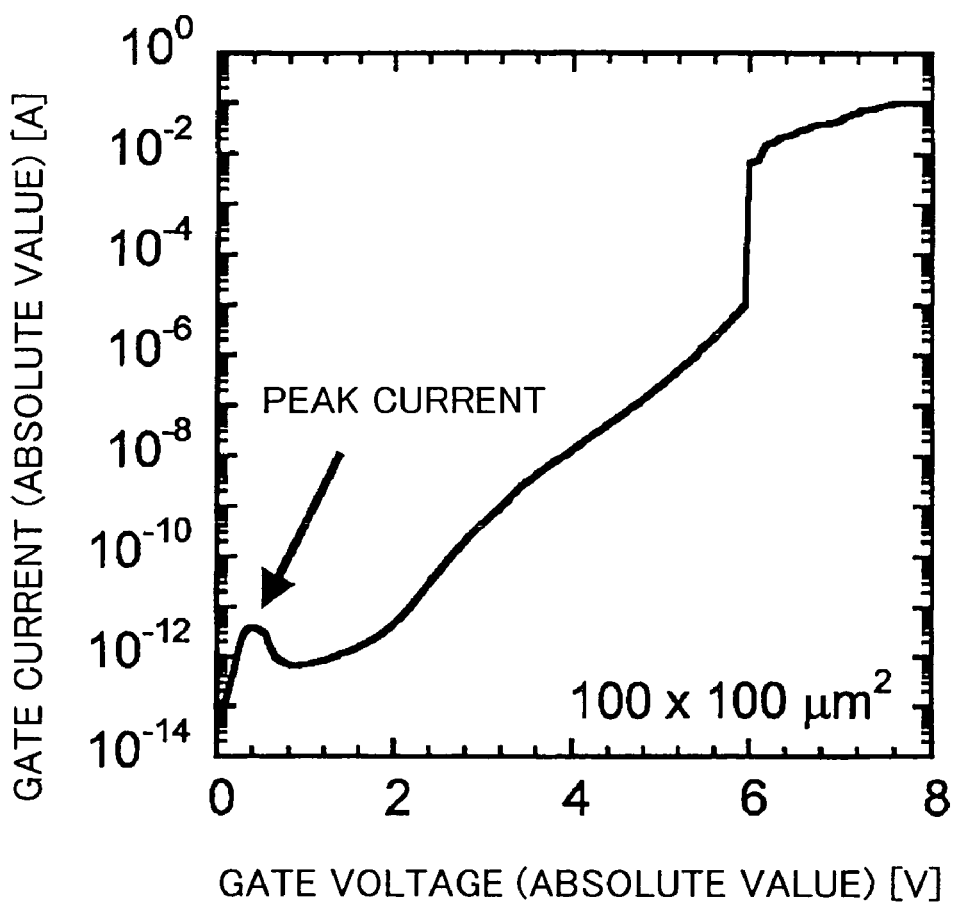
FIG. 1B is a graph showing a current-voltage characteristic in a capacitor having a MOS structure shown in FIG. 1A.

FIG. 1B shows a current-voltage characteristic in a capacitor having a metal oxide semiconductor (MOS) structure shown in FIG. 1A in which a p-type substrate is used as the silicon substrate 1. The current-voltage characteristic is obtained by applying a negative bias to the gate electrode 3 of the capacitor of a 100 μm square.

As shown in FIG. 1B, a peak current flows at a gate voltage of about −0.5 V. Thereafter, as the gate voltage (absolute value) increases, the gate current (absolute value) increases. When the gate voltage is about −6 V, dielectric breakdown of the gate insulating film 2 occurs.

Figure 2:
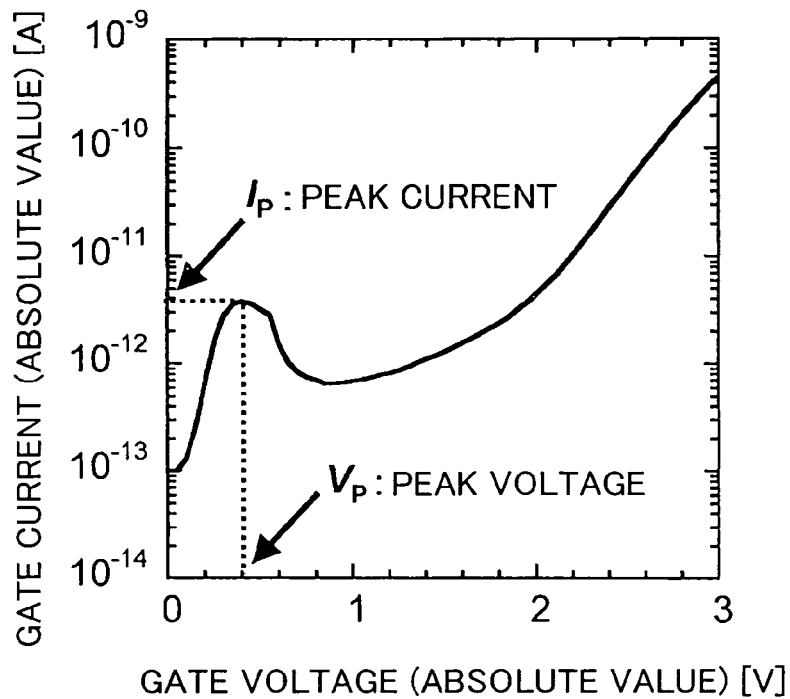
FIG. 2 is a graph for showing definitions of a peak voltage ($V_p$) and a peak current amount ($I_p$) when a low voltage peak current shown in FIG. 1B flows.

In this embodiment, attention is focused on the peak current (hereinafter, refereed to as a low voltage peak current: LVPC). FIG. 2 is a graph showing a low voltage peak current shown in FIG. 1B and a current-voltage characteristic near the peak current in an enlarged manner. As shown in FIG. 2, a peak current amount $I_p$ when the low voltage peak current flows and a corresponding voltage (peak voltage) $V_p$ are defined as a gate current amount and a gate voltage, respectively, when the gate current amount (absolute value) is at a local (relative) maximum.

Figure 3:
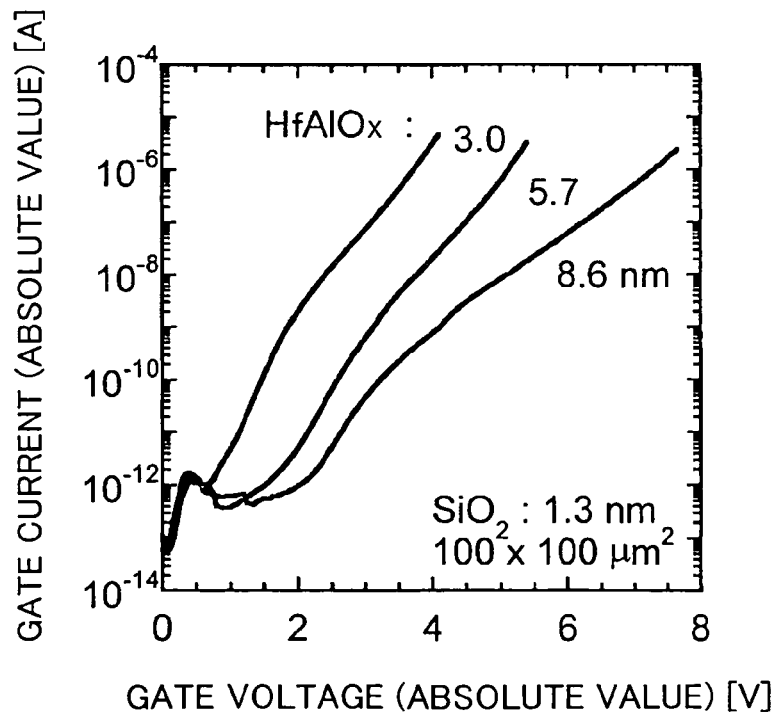
FIG. 3 is a graph showing a current-voltage characteristic in a capacitor having the MOS structure shown in FIG. 1A when the thickness of a HfAlO$_x$ film constituting a gate insulating film in the capacitor is varied (with the thickness of a SiO$_2$ film as a lower insulating film unchanged).
Figure 4:
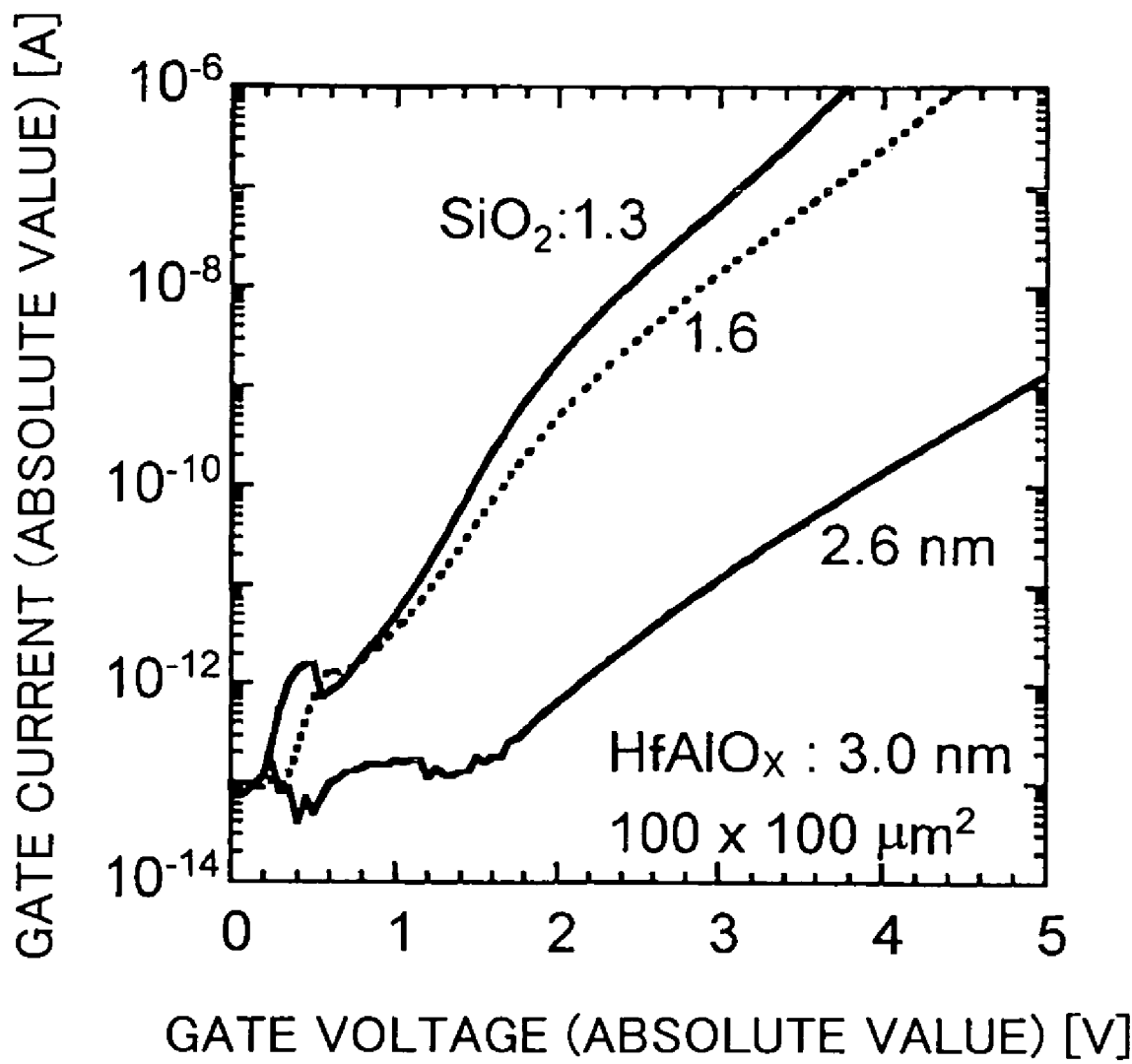
FIG. 4 is a graph showing a current-voltage characteristic in a capacitor having the MOS structure shown in FIG. 1A when the thickness of a SiO$_2$ film constituting a gate insulating film in the capacitor is varied (with the thickness of a HfAlO$_x$ film as an upper insulating film unchanged).

FIG. 3 shows variations of current-voltage characteristics with different thicknesses of the $HfAlO_x$ film 2B in the capacitor having the MOS structure shown in FIG. 1A. FIG. 4 shows variations of current-voltage characteristics with different thicknesses of the $SiO_2$ film 2A in the capacitor having the MOS structure shown in FIG. 1A. The result shown in FIG. 3 is obtained with the thickness of the $SiO_2$ film 2A fixed at 1.3 nm and the thickness of the $HfAlO_x$ film 2B varied to 3.0 nm, 5.7 nm and 8.6 nm in the capacitor of a 100 μm square. The result shown in FIG. 4 is obtained with the thickness of the $HfAlO_x$ film 2B fixed at 3.0 nm and the thickness of the $SiO_2$ film 2A varied to 1.3 nm, 1.6 nm and 2.6 nm in the capacitor of a 100 μm square.

As shown in FIGS. 3 and 4, the peak voltage and the peak current amount hardly depend on the thickness of the $HfAlO_x$ film but greatly depend on the thickness of the $SiO_2$ film. This shows that the peak current is a current generated by movement of charge (electrons or holes) from the substrate to the vicinity of the interface between the $HfAlO_x$ film and the $SiO_2$ film through the $SiO_2$ film. That is, the results shown in FIGS. 3 and 4 show that it is possible to estimate the thickness of the $SiO_2$ film independently of the $HfAlO_x$ film by using the low voltage peak current.

Figure 5A:
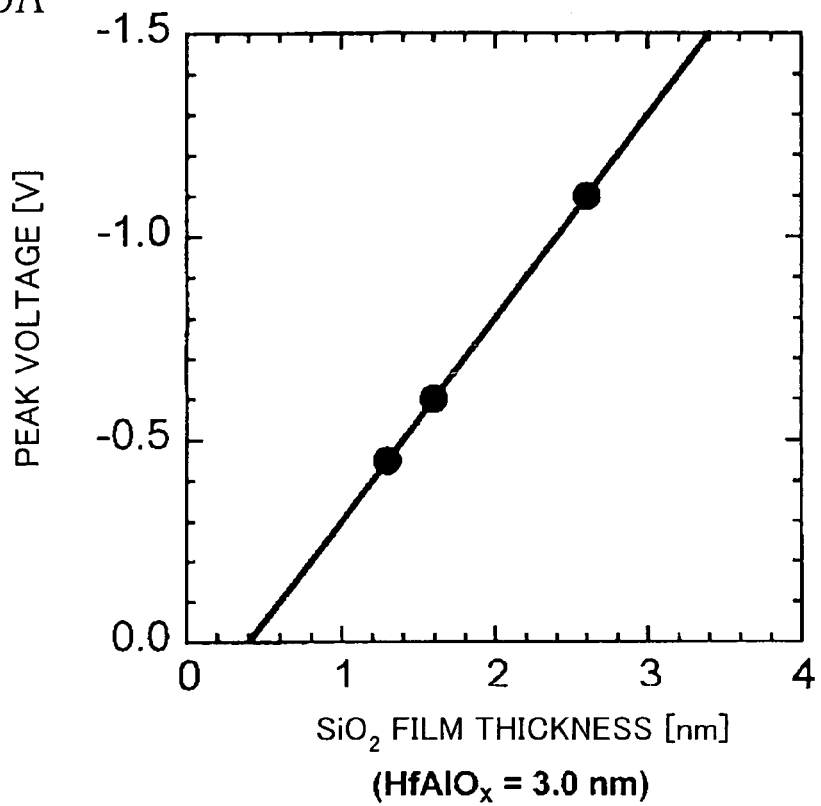
FIG. 5A is a graph showing a correlation between the thickness of the SiO$_2$ film as the lower insulating film and the peak voltage ($V_p$) in a low voltage peak current mode obtained from the result shown in FIG. 4.
Figure 5B:
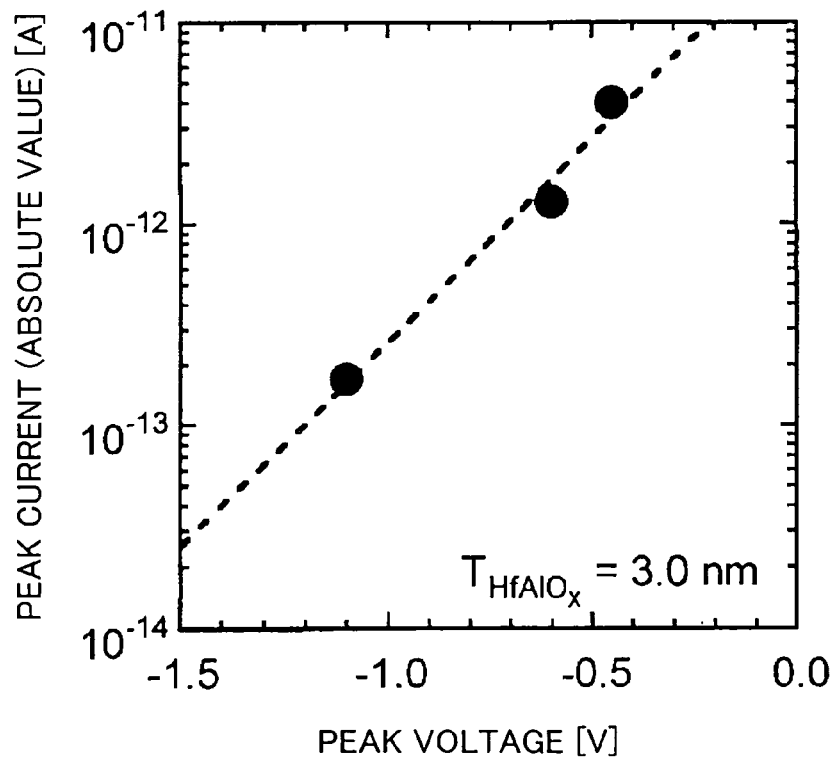
FIG. 5B is a graph showing a correlation between the peak current amount ($I_p$) and the peak voltage ($V_p$) in the low voltage peak current mode obtained from the result shown in FIG. 4.

FIG. 5A shows a correlation between the thickness of the $SiO_2$ film and the peak voltage obtained from the result shown in FIG. 4. FIG. 5B shows a correlation between the peak current amount and the peak voltage obtained from the result shown in FIG. 4. As shown in FIG. 5A, the thickness of the $SiO_2$ film and the peak voltage has a one-to-one relationship so that it is possible to estimate the thickness of the $SiO_2$ film by using the peak voltage value. In FIG. 5B, $T_{HfAlOx}$ denotes the thickness of the $HfAlO_x$ film in the multilayer insulating film made up of the $SiO_2$ film and the $HfAlO_x$ film.

Figure 6:
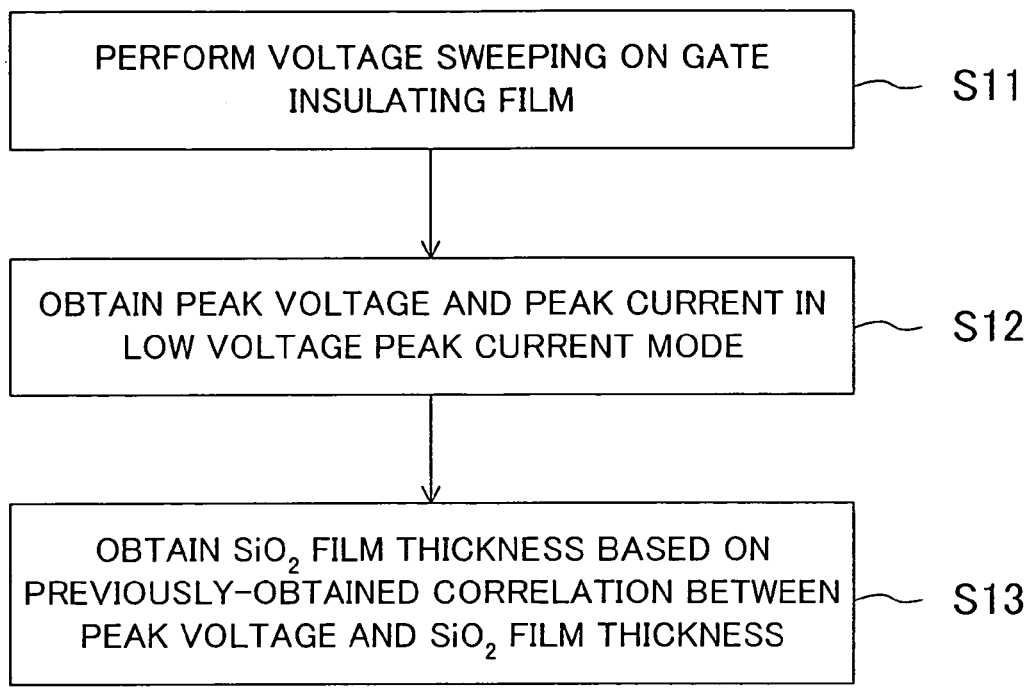
FIG. 6 is a flowchart of the semiconductor-device evaluating method of the first embodiment.

FIG. 6 is a flowchart of a method for evaluating a semiconductor device according to the first embodiment.

First, at step S11, gate voltage sweeping is performed on a MOS capacitor using a gate insulating film including a $SiO_2$ film as a lower insulating film whose thickness is to be obtained. Subsequently, at step S12, a low voltage peak current mode is extracted from the current-voltage characteristic obtained at the step S11, and a peak voltage and a peak current amount in this mode are obtained.

Then, at step S13, the thickness of the $SiO_2$ film as the lower insulating film of the gate insulating film is estimated based on the peak voltage obtained at the step S12 and a previously-obtained correlation between the peak voltage and the thickness of the $SiO_2$ film.

As described above, in this embodiment, the thickness of the lower insulating film (the $SiO_2$ film in this embodiment) is estimated more easily and more accurately without using a physical technique such as cross-section TEM observation.

In this embodiment, the peak current amount and the peak voltage also have a correlation as shown in FIG. 5B.

Therefore, at step S13, it is also possible to estimate the thickness of the $SiO_2$ film by using the measured value of the peak current amount instead of the measured value of the peak voltage and using a correlation between the peak current amount and the thickness of the $SiO_2$ film instead of the correlation between the peak voltage and the thickness of the $SiO_2$ film.

In this embodiment, a technique of estimating the thicknesses of the $SiO_2$ film based on the respective measured values of the peak current amount and the peak voltage and comparing these estimated thicknesses with each other, more specifically determining the estimated film thicknesses having a difference of 10% or less to be effective, may be adopted, for example. In such a case, the film thickness is estimated more accurately.

In this embodiment, the thickness of the $SiO_2$ film that is the lower insulating film in the gate insulating film 2 having the double-layer structure of the $SiO_2$ film 2A and the $HfAlO_x$ film 2B is estimated. Alternatively, the thickness of the lowermost insulating film in a gate insulating film having a multilayer structure of three or more layers may be estimated. The type of an insulating film whose thickness is to be estimated is not specifically limited.

Embodiment 2

Hereinafter, a method for evaluating a semiconductor device according to a second embodiment of the present invention will be described with reference to drawings. This method is used for predicting a dielectric breakdown lifetime of a gate insulating film.

Figure 7:
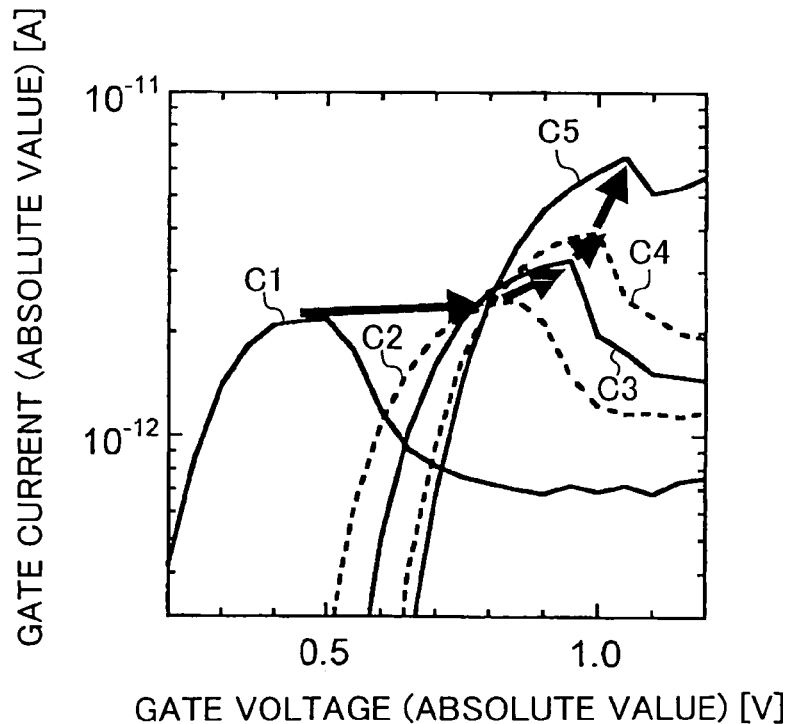
FIG. 7 is a graph showing variation behavior of a current-voltage characteristic (especially a low voltage peak current)

FIG. 7 shows variation behavior of a current-voltage characteristic (especially low voltage peak current) when a constant voltage stress of −5.5 V is repeatedly applied to a MOS capacitor including a gate insulating film as a stack of a lower $SiO_2$ film with a thickness of 1.3 nm and an upper $HfAlO_x$ film with a thickness of 5.7 nm. In FIG. 7, C1 through C5 represent current-voltage characteristics at respective points in time, and the arrows indicate a movement of peak positions (positions where low voltage peak current occurs) of the respective current-voltage characteristics as the stressing time passes.

As shown in FIG. 7, as the stressing time passes, the peak voltage (absolute value) greatly increases for an initial period and becomes unchanged afterward. On the other hand, the peak current amount (absolute value) slightly varies for an initial period and greatly increases afterward.

FIG. 8 is a graph in which variations of the peak voltage and the peak current amount obtained by repeatedly applying constant voltage stress to the MOS capacitor are plotted with respect to the stressing time (during which stress is applied). In FIG. 8, white circles represent the peak current amount and black circles represent the peak voltage. As shown in FIG. 8, the peak voltage and the peak current amount have tendencies similar to those shown in FIG. 7. Specifically, the variation of the peak voltage is saturated near the stressing time indicated by the dashed line.

FIG. 9 is a graph in which a variation of the dielectric breakdown lifetime is plotted with respect to a variation of the stress voltage and a variation of the time required for the peak voltage variation described above to be saturated (i.e., the time required for the peak voltage to be substantially constant, hereinafter referred to as a peak voltage variation saturation time) is also plotted with respect to the variation of the stress voltage. The results shown in FIG. 9 are obtained by performing a constant voltage stress (CVS) application (test) on a capacitor with a size of 0.01 mm². As shown in FIG. 9, the slopes of the dielectric breakdown lifetime and the peak voltage variation saturation time approximately coincide with each other, and the peak voltage variation saturation time is about one-twentieth of the dielectric breakdown lifetime at each stress voltage.

The foregoing results show that it is possible to predict the dielectric breakdown lifetime by evaluating the peak voltage variation saturation time. Specifically, the dielectric breakdown lifetime is predicted by measuring the peak voltage variation saturation time without measurement of the dielectric breakdown lifetime. This enables a large reduction of the time necessary for measurement for predicting the lifetime. For example, in the case of the above-described sample (MOS capacitor), the time necessary for the measurement can be reduced to about one-twentieth.

FIG. 10 is a flowchart of a method for evaluating a semiconductor device according to the second embodiment based on the foregoing findings, more specifically a method for predicting the dielectric breakdown lifetime of a gate insulating film.

First, at step S21, a predetermined stress voltage (reference stress voltage) $V_0$ is applied between a gate electrode and a substrate sandwiching a gate insulating film therebetween, and the time required for dielectric breakdown of the gate insulating film to occur is measured as a dielectric breakdown lifetime (reference dielectric breakdown lifetime) $T_{BD0}$. For this application of the stress voltage, an arbitrary technique such as a constant voltage stress (CVS) technique or a constant current stress (CCS) technique may be used.

Next, at step S22, the stress voltage $V_0$ is repeatedly applied to the gate insulating film, and a variation of the peak voltage with respect to the stressing time when a low voltage peak current flows is measured. At this time, the peak voltage variation may be obtained by repeatedly performing stress application for a given period and measurement of the current-voltage characteristic, for example. Subsequently, from the measured peak voltage variation, the stressing time required for the amount of variation of the peak voltage to be saturated (i.e., stressing time required for the peak voltage to be substantially constant or the stressing time required for the peak voltage variation with respect to the stressing time to be substantially negligible) is obtained as a first saturation time $T_{P0}$.

Then, at step S23, a stress voltage $V_1$ for predicting the dielectric breakdown lifetime of the gate insulating film in actual operation is repeatedly applied to the gate insulating film, so that a variation of the peak voltage with respect to the stressing time when a low voltage peak current flows is measured. At this time, the peak voltage variation may be obtained by repeatedly performing stress application for a given period and measurement of the current-voltage characteristic, for example. Subsequently, from the measured peak voltage variation, the stressing time required for the amount of variation of the peak voltage to be saturated (i.e., stressing time required for the peak voltage to be substantially constant or the stressing time required for the peak voltage variation with respect to the stressing time to be substantially negligible) is obtained as a second saturation time $T_{P1}$.

Lastly, at step S24, a dielectric breakdown lifetime $T_{BD1}$ under application of the stress voltage $V_1$ is calculated based on the reference dielectric breakdown lifetime $T_{BD0}$ measured at the step S21, the first saturation time $T_{P0}$ obtained at the step S22 and the second saturation time $T_{P1}$ obtained at the step S23. In this case, based on the finding that the ratio between the dielectric breakdown lifetime and the peak voltage variation saturation time is almost constant irrespective of the stress voltage as shown in FIG. 9, for example, the following equation (1):

$$T_{BD1} = T_{BD0} \times T_{P1}/T_{P0} \quad (1)$$

may be used.

As described above, it is possible to predict the dielectric breakdown lifetime by evaluating the peak voltage variation saturation time in this embodiment. This enables accurate prediction of the dielectric breakdown lifetime only by measuring the peak voltage variation saturation time without actually measuring the time of the dielectric breakdown lifetime, i.e., without performing a large number of lifetime measurements for statistical processing on the results thereof. Accordingly, the time necessary for measurement is greatly reduced and the dielectric breakdown lifetime is easily and accurately predicted.

In this embodiment, to reduce the time necessary for measuring the peak voltage variation saturation time, a voltage (absolute value) higher than the stress voltage $V_1$ for predicting the dielectric breakdown lifetime of the gate insulating film in actual operation is preferably used as the stress voltage (reference stress voltage) $V_0$.

In this embodiment, the dielectric breakdown lifetime $T_{BD1}$ is obtained by using the reference dielectric breakdown lifetime $T_{BD0}$, the first saturation time $T_{P0}$ and the second saturation time $T_{P1}$. Alternatively, a total injected charge amount $Q_{BD1}$ for the dielectric breakdown lifetime $T_{BD1}$ may be calculated by using a total injected charge amount $Q_{BD0}$ for the reference dielectric breakdown lifetime $T_{BD0}$, the first saturation time $T_{P0}$ and the second saturation time $T_{P1}$, according to the following equation (2):

$$Q_{BD1} = Q_{BD0} \times T_{P1}/T_{P0} \quad (2)$$

Alternatively, the total injected charge amount $Q_{BD1}$ for the dielectric breakdown lifetime $T_{BD1}$ may be calculated by using the total injected charge amount $Q_{BD0}$ for the reference dielectric breakdown lifetime $T_{BD0}$, a total injected charge amount $Q_{P0}$ for the first saturation time $T_{P0}$ and a total injected charge amount $Q_{P1}$ for the second saturation time $T_{P1}$, according to the following equation (3):

$$Q_{BD1} = Q_{BD0} \times Q_{P1}/Q_{P0} \quad (3)$$

Embodiment 3

Hereinafter, an apparatus for evaluating a semiconductor device according to a third embodiment of the present invention, specifically an evaluation apparatus for use in the semiconductor-device evaluating methods of the first and second embodiments will be described with reference to a drawing.

FIG. 11 is a view schematically showing an example of a configuration of an apparatus for evaluating a semiconductor device (an apparatus for evaluating an insulating film) according to the third embodiment.

As shown in FIG. 11, the insulating-film evaluating apparatus of this embodiment includes: a sample holder (wafer stage) 15 for holding a sample (a semiconductor element including an insulating film to be evaluated) 10; a probe 11 electrically in contact with the sample 10 placed on the sample holder 15; a measurement section 19 for applying electrical stress to the sample 10 via the probe 11 and measuring a current and a voltage of the sample 10; and an analysis section 20 for analyzing data obtained by the measurement section 19.

The sample 10 includes: a silicon substrate 14; an insulating film 13 formed on the silicon substrate 14 and having a multilayer structure; and a gate electrode 12 formed on the insulating film 13. The holder 15 holding the sample 10 has a temperature adjusting mechanism so as to allow heating or cooling of the sample 10 during a stressing process. The holder 15 is electrically in contact with the silicon substrate 14 of the sample 10 and is also grounded. Accordingly, an electrical contact of the probe 11 with the gate electrode 12 of the sample 10 enables application of a given voltage between the gate electrode 12 and the silicon substrate 14.

The measurement section 19 includes: a voltage applying part 16; a current measuring part (an ammeter) 17; and a recording part 18. The voltage applying part 16 applies an evaluation voltage (a stress voltage of, for example, −6 V) to the sample 10 during the stressing process and applies various voltages (e.g., −4 V) to the sample 10 during a process of measuring a current amount. The current measuring part 17 measures the amount of a current flowing in the insulating film 13 at applications of various voltages to the sample 10 during the process of measuring the current amount. Each of the measured current amounts is recorded in the recording part 18 in association with the point in time of the measurement (stressing time t) or the applied voltage.

If the method for evaluating a semiconductor device of the first embodiment is carried out by using the evaluation apparatus of the third embodiment, the evaluation apparatus operates as follows. That is, gate voltage sweeping is performed on the sample 10 by using the probe 11 and the voltage applying part 16 so that the amount of a current flowing in the insulating film 13 at this time is measured by the current measuring part 17. The measured current amount is recorded in the recording part 18 in association with the gate voltage. The data recorded in this way is analyzed by the analysis section 20. Thereafter, the low voltage peak current mode is determined and the peak current amount and the peak voltage in this mode are extracted. Based on the obtained peak current amount or peak voltage and a previously-obtained correlation between the peak current amount or peak voltage and the thickness of the lowermost insulating film (e.g., a $SiO_2$ film) of the insulating film 13, the thickness of the lowermost insulating film is estimated by the analysis section 20.

If the method for evaluating a semiconductor device of the second embodiment is carried out by using the evaluation apparatus of the third embodiment, the evaluation apparatus operates as follows. That is, application of stress voltages $V_0$ and $V_1$ and application of a gate voltage for obtaining a current-voltage characteristic are performed on the sample 10 by using the probe 11 and the voltage applying part 16 so that the amount of a current flowing in the insulating film 13 at this time is measured by the current measuring part 17. The measured current amount is recorded in the recording part 18 in association with the stress voltages, the stressing times and the gate voltage. The data recorded in this way is analyzed by the analysis section 20. Thereafter, a dielectric breakdown lifetime (reference dielectric breakdown lifetime) $T_{BD0}$ under application of the stress voltage (reference stress voltage) $V_0$ is determined, low voltage peak current modes associated with the respective stress voltages $V_0$ and $V_1$ are determined, and the peak current amounts and the peak voltages in the respective modes are extracted. In addition, a first saturation time $T_{P0}$ and a second saturation time $T_{P1}$ associated with the respective stress voltages $V_0$ and $V_1$ are extracted by the analysis section 20 from variations of the obtained peak current amounts and peak voltages with respect to the stressing times. Further, the dielectric breakdown lifetime $T_{BD1}$ under application of the stress voltage $V_1$ is obtained by the analysis section 20 based on the reference dielectric breakdown lifetime $T_{BD0}$, the first saturation time $T_{P0}$ and the second saturation time $T_{P1}$.

What is claimed is:

1. A method for evaluating a semiconductor device, the method being used for obtaining a dielectric breakdown lifetime of an insulating film that has a multilayer structure and is included in a semiconductor element under application of a given stress voltage, the method comprising the steps of:
   (a) measuring, as a reference dielectric breakdown lifetime, a time required for dielectric breakdown of the insulating film to occur by application of a reference stress voltage between a pair of electrodes sandwiching the insulating film therebetween;
   (b) measuring the amount of a variation of a peak voltage caused by the application of the reference stress voltage, the peak voltage being a voltage applied between the pair of electrodes when an absolute value of the amount of a current flowing in the insulating film upon application of the voltage between the pair of electrodes is at a local maximum;
   (c) obtaining a first saturation time required for the amount of the variation of the peak voltage measured at the step (b) to be saturated,
   (d) measuring the amount of a variation of the peak voltage caused by the application of the given stress voltage;
   (e) obtaining a second saturation time required for the amount of the variation of the peak voltage measured at the step (d) to be saturated; and
   (f) obtaining the dielectric breakdown lifetime under the application of the given stress voltage, based on the reference dielectric breakdown lifetime measured at the step (a), the first saturation time obtained at the step (c) and the second saturation time obtained at the step (e).

2. An apparatus for evaluating a semiconductor device, the apparatus being used for obtaining a dielectric breakdown lifetime of an insulating film that has a multilayer structure and is included in a semiconductor element under application of a given stress voltage, the apparatus comprising:
   a wafer stage for holding the semiconductor element;
   a probe for applying a given voltage between a pair of electrodes sandwiching the insulating film therebetween; and
   an ammeter for measuring the amount of a current flowing in the insulating film,
   wherein a time required for dielectric breakdown of the insulating film to occur by application of a reference stress voltage between the pair of electrodes by using the probe is measured as a reference dielectric breakdown lifetime;
   the amount of a current flowing in the insulating film upon application of a voltage between the pair of electrodes by using the probe is measured by using the ammeter, and the amount of a variation of a peak voltage, which is a voltage applied between the pair of electrodes when an absolute value of the measured amount of the current is at a local maximum, caused by the application of the reference stress voltage is obtained,
   a first saturation time required for the amount of the variation of the peak voltage caused by the application of the reference stress voltage to be saturated is obtained,
   the amount of a variation of the peak voltage caused by the application of the given stress voltage is obtained,
   a second saturation time required for the amount of the variation of the peak voltage caused by the application of the given stress voltage to be saturated is obtained, and
   the dielectric breakdown lifetime under the application of the given stress voltage is obtained, based on the reference dielectric breakdown lifetime, the first saturation time and the second saturation time.

* * * * *